United States Patent
Ogawa et al.

(10) Patent No.: US 9,673,021 B2
(45) Date of Patent: Jun. 6, 2017

(54) POSITIONING CONTROL DEVICE

(71) Applicant: Hitachi, Ltd., Tokyo (JP)

(72) Inventors: Hironori Ogawa, Tokyo (JP); Tomohiro Inoue, Tokyo (JP); Masaki Odai, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 129 days.

(21) Appl. No.: 14/601,327

(22) Filed: Jan. 21, 2015

(65) Prior Publication Data

US 2015/0279613 A1 Oct. 1, 2015

(30) Foreign Application Priority Data

Mar. 25, 2014 (JP) ................................. 2014-061119

(51) Int. Cl.
*H01J 37/20* (2006.01)
*G01B 11/14* (2006.01)
(Continued)

(52) U.S. Cl.
CPC .............. *H01J 37/20* (2013.01); *G01B 11/14* (2013.01); *G05B 19/404* (2013.01);
(Continued)

(58) Field of Classification Search
CPC combination set(s) only.
See application file for complete search history.

(56) References Cited

U.S. PATENT DOCUMENTS

| 5,798,530 A | 8/1998 | Okumura |
| 5,828,573 A | 10/1998 | Hayashi |
| (Continued) |

FOREIGN PATENT DOCUMENTS

| JP | 5-182983 A | 7/1993 |
| JP | 6-168867 A | 6/1994 |
| (Continued) |

OTHER PUBLICATIONS

Extended European Search Report received in corresponding European Application No. 15153715.6 dated May 13, 2016.
(Continued)

*Primary Examiner* — Phillip A Johnston
*Assistant Examiner* — Hsien Tsai
(74) *Attorney, Agent, or Firm* — Mattingly & Malur, PC

(57) ABSTRACT

An object of the invention is to provide a positioning apparatus and a positioning control device that may perform precise positioning by suppressing relative displacement of a movable point and positioning target objects. In a positioning apparatus including a movable stage, a stage position detector that detects a position of the movable stage, a control device that performs positioning of the movable stage, a positioning target object for positioning of the movable stage, and at least one or more sensors in a structure of the positioning target object or the movable stage, the control device includes an amount of relative displacement estimation unit that estimates an amount of relative displacement of the movable stage and the positioning target object using information of the sensor and information of the stage position detector, and a unit that controls the position of the stage using information calculated by the amount of relative displacement estimation unit.

16 Claims, 5 Drawing Sheets

(51) Int. Cl.
*H01J 37/26* (2006.01)
*G05B 19/404* (2006.01)

(52) U.S. Cl.
CPC .. *H01J 37/261* (2013.01); *G05B 2219/37612* (2013.01); *G05B 2219/42249* (2013.01); *G05B 2219/49176* (2013.01); *H01J 2237/2007* (2013.01); *H01J 2237/20292* (2013.01); *H01J 2237/2602* (2013.01)

(56) References Cited

U.S. PATENT DOCUMENTS

| | | | |
|---|---|---|---|
| 6,385,498 | B1 | 5/2002 | Hayashi |
| 6,975,086 | B1* | 12/2005 | Honda ..................... G05B 5/01 318/135 |
| 2005/0045821 | A1* | 3/2005 | Noji ..................... G01N 23/225 250/311 |
| 2009/0191651 | A1* | 7/2009 | Egashira ............. G03F 7/70508 438/16 |
| 2010/0264335 | A1* | 10/2010 | Hoyle ..................... B82Y 10/00 250/492.3 |

FOREIGN PATENT DOCUMENTS

| | | |
|---|---|---|
| JP | 9-139338 A | 5/1997 |
| JP | 2000-100883 A | 4/2000 |
| JP | 2007-49056 A | 2/2007 |
| JP | 2009-130355 | 11/2009 |

OTHER PUBLICATIONS

Translation of Japanese Office Action received in corresponding Japanese Application No. 2014-061119 dated Mar. 28, 2017.

\* cited by examiner

POSITIONING CONTROL DEVICE

BACKGROUND OF THE INVENTION

1. Field of the Invention

The present invention relates to a positioning control device mainly used for an industrial machine.

2. Description of the Related Art

In industrial machines, positioning mechanisms represented by stage mechanisms have important roles. For example, in manufacturing and inspection apparatuses in the semiconductor field, the positioning accuracy of the stage mechanisms is a significant factor for determination of the accuracy of mechatronics products. Further, in component mounting apparatuses for mounting components on substrates, the positioning mechanisms are also used as an important element for determination of the mounting accuracy and technologies for improvement of the positioning accuracy are developed.

The positioning mechanism is controlled by a control device and positioned. Generally, a position detector is attached to the positioning mechanism and, in the control device, the so-called servo control system that makes the difference between position information obtained by the position detector and a desired target position zero is configured. The parameters of the servo control system are adjusted to satisfy required positioning performance according to the characteristics of the positioning mechanism.

On the other hand, the performance required when the positioning apparatus is actually used in the industrial machine is often positioning of one point on the positioning mechanism at another point as a positioning target object, not making position information obtained by the position detector to coincide with a target position. In the semiconductor inspection apparatus, positioning of a semiconductor wafer placed on the stage mechanism, i.e., an arbitrary point on the semiconductor wafer with an exposure beam or an inspection beam without errors is required for determination of the apparatus performance. That is, in the positioning apparatus, not the positioning accuracy of the positioning mechanism, but suppression of relative displacement between two points to be actually positioned is required because of direct linkage to the apparatus performance. Here, of the two points for calculation of relative displacement, the point that can be moved largely by the stage or the like is referred to as "movable point" and the other point is referred to as "positioning target object point". The relative displacement as the positioning requirement is an amount of displacement of the movable point with reference to the positioning target object point, and the amount of displacement of the movable point has a significant effect on the apparatus performance. Further, in the positioning apparatus, there may be a plurality of positioning target object points. For example, one movable point may be sequentially positioned with respect to three target points A, B, C (a total of three times of positioning operation). In this case, different relative displacements are caused for the respective positioning target object points, and it is conceivable that positioning characteristics differ for the respective movements.

In related art, various improvements have been made for improving the positioning accuracy in the positioning mechanism itself. Further, in addition to the accuracy improvement in the positioning mechanism itself, there is a technology of reducing the amount of displacement of the movable point by suppressing vibration of the movable point to suppress the amount of relative displacement. As a related technology, JP-A-2009-130355 (Patent Document 1) is known, and a technology of suppressing vibration of a projection system using a sensor adapted to detect the vibration of the projection system and an actuator adapted to apply a force to the projection system to improve the positioning accuracy of the relative position of the projection system and a wafer table is disclosed.

According to the technology disclosed in Patent Document 1, displacements of the movable point and the positioning target object point are independently suppressed for one purpose of reduction of the amount of relative displacement, and thus, the system is complex. Further, the amount of relative displacement directly linked to the apparatus performance is not calculated within the control device, and there is no means for the user to know the amount of relative displacement. Furthermore, when a plurality of positioning target object points are within the apparatus, many actuators for suppression of the amount of relative displacement are necessary, and the apparatus is complex and the cost increases.

SUMMARY OF THE INVENTION

The invention has been achieved in view of the above described problems, and an object of the invention is to provide a positioning control device that may be applied to a positioning mechanism requiring precise positioning of relative displacement between two points.

In order to solve the problems, in a positioning apparatus including a movable stage, a stage position detector that detects a position of the movable stage, a control device that performs positioning of the movable stage, a positioning target object for positioning of the movable stage, and at least one or more sensors in a structure of the positioning target object or the movable stage, the control device includes an amount of relative displacement estimation unit that estimates an amount of relative displacement of the movable stage and the positioning target object using information of the sensor and information of the stage position detector, and a unit that controls the position of the stage using information calculated by the amount of relative displacement estimation unit.

According to the invention, the positioning control device, estimates amounts of relative displacement of a movable point and a plurality of positioning target object points with high accuracy and the amounts of relative displacement corresponding to the positioning target object points are changed for each, positioning movement, and thereby, high-precision relative positioning may be realized, the amounts of relative displacement may be disclosed to a user, and management of apparatus performance may be easier.

DETAILED DESCRIPTION OF THE EMBODIMENTS

As below, examples will be explained using the drawings.

Example 1

First, an embodiment when the invention is applied to a semiconductor inspection apparatus is explained.

Figure 1:
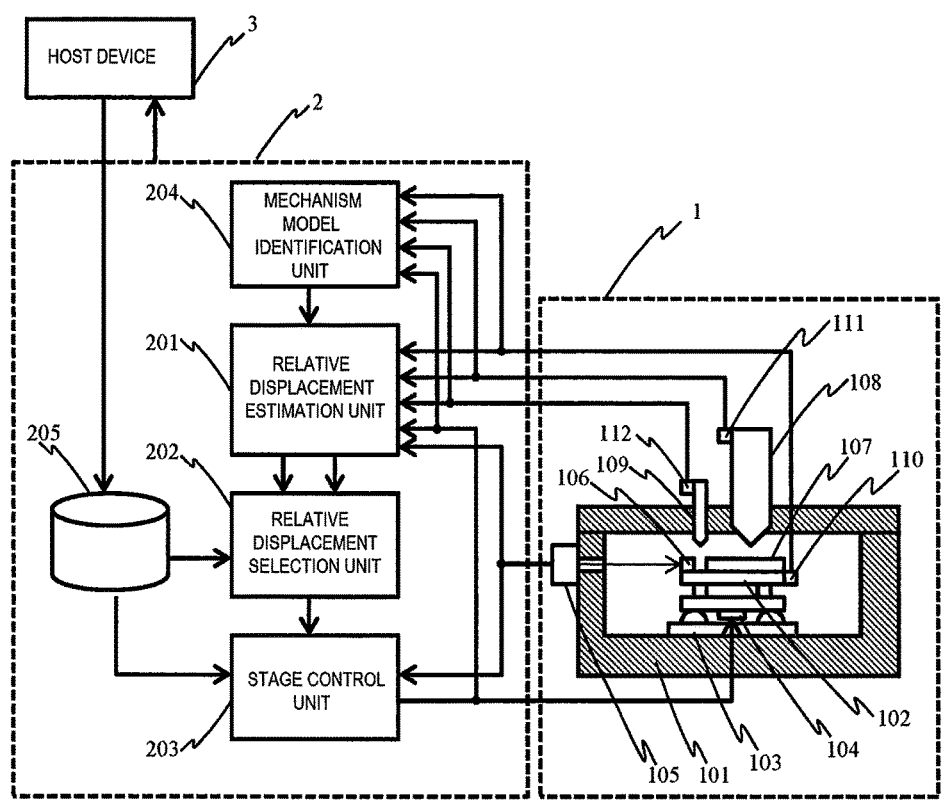
FIG. 1 is a conceptual diagram showing a configuration of a positioning apparatus in example 1.

FIG. 1 is a conceptual diagram showing a configuration of a positioning apparatus in an example In FIG. 1, the positioning apparatus includes a positioning mechanism 1, a control device 2, and a host device 3. In the positioning mechanism 1, within a sample chamber 101, a movable table 102 movable with respect to the sample chamber 101 is provided and the movable table 102 is driven by a linear motor (a stator 103 and a mover 104). Though not illustrated in FIG. 1, a guide mechanism is generally provided between the sample chamber 101 and the movable table 102. For the guide mechanism, a guide mechanism usually used in the field such as a rolling guide, a sliding guide, or a bearing using magnetism, air, or the like may be used. An interference mirror 106 is provided on the movable table 102, and position information of the movable table 102 is measured by a laser interferometer 105. A semiconductor wafer 107 is fixed onto the movable table and an electron microscope 108 and an optical microscope 109 are attached to a top panel of the sample chamber 101. According to the above described configuration, an arbitrary position of the semiconductor wafer 107 is positioned under the electron microscope 108 or the optical microscope 109 using drive force of the linear motor 103, 104, and thereby, observation and inspection of the wafer may be performed. Acceleration sensors 110, 111, 112 are attached to the movable table 102, the electron microscope 108, the optical microscope 109, respectively.

Here, for explanation in FIG. 1, the movable table 102 is provided to be movable in only one direction with respect to the sample chamber 101, however, actually, the table may be naturally adapted to have degrees of freedom along two or more axes like an XY-stage or an XYθ-stage. Further, in the invention, the stage may be formed using various drive mechanisms including a ball screw and a piezoelectric element in place of the linear motor. Furthermore, in the example, the laser interferometer is used for a position detector of the movable table, however, another method, e.g., a linear scale or the like may be used.

In the control device 2, a mechanism model identification unit 204 identifies a mechanism model necessary for estimation of relative displacement using a method, which will be described later. A relative displacement estimation unit 201 estimates amounts of relative displacement using information of the acceleration sensors 110, 111, 112 and the laser interferometer 105, a stage drive force output by a stage control unit 203, and the mechanism model identified by the mechanism model identification unit 204. The details of the estimation method will be described later. Here, the obtained amounts of relative displacement are two amounts of relative displacement of the amount of relative displacement of the measurement point on the semiconductor wafer 107 and the electron microscope 108 and the amount of relative displacement of the measurement point on the semiconductor wafer 107 and the optical microscope 109.

A relative displacement selection unit 202 selects the amount of relative displacement relative to a current positioning target object of the amounts of relative displacement estimated by the relative displacement estimation unit 201 using information of the positioning target object of the movement parameters stored in a parameter storage unit 205.

The stage control unit 203 calculates and outputs the drive force of the linear motor 103, 104 using the amount of relative displacement relative to the selected positioning target object point, the information of the laser interferometer 105, and the movement condition of the stage stored in the parameter storage unit 205.

The host device 3 sets the parameters for the parameter storage unit in the control device 2, and includes a user interface and receives various statuses from the control device 2 and notifies the user. The notification method may use not only display on the screen, but also file output of log data or the like.

Here, the movement parameters stored in the parameter storage unit 205 are set for each stage movement by the host device 3. That is, the host device 3 is required to give information to the parameter storage unit 205 as to a positioning target object to be positioned with respect to each stage movement. Further, the setting of the parameters by the host device 3 may store target position information and positioning target object information with respect to a plurality of points as continuous movement patterns.

Note that, in the example, the case where the number of positioning target object points is two is explained, however, the actual number of positioning target object points may be arbitrarily set. For example, positioning with respect to another sensor position, positioning with respect to a robot hand for wafer transportation, or the like may be used.

Note that the acceleration sensors 110, 111, 112 may be formed by sensors for detecting other physical quantities than acceleration. For example, the same effect may be expected using a displacement sensor or strain sensor. Further, in the example, one sensor is provided for each of the movable table 102, the electron microscope 108, and the optical microscope 109, however, a plurality of sensors may be provided for each structure, and thereby, the amounts of relative displacement may be estimated more accurately. In contrast, when the accuracy requirement for relative positioning is not so high and the rigidity of the positioning target object is sufficiently high and deformation is negligible, positioning by the movable table itself may be performed without providing sensors for each structure. Thereby, the complex system and the cost increase may be suppressed.

Figure 2:
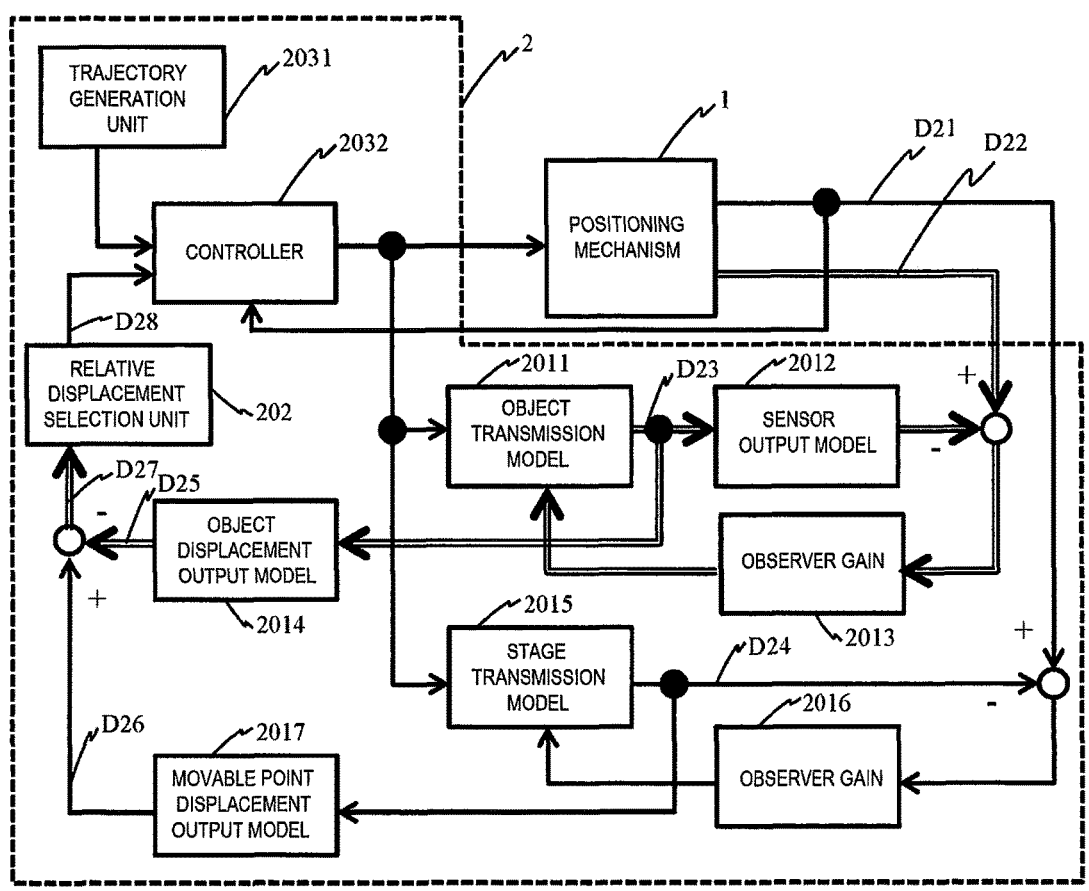
FIG. 2 is a block diagram with respect to a method of estimating relative displacement and a control method in example 1.

FIG. 2 is a block diagram with respect to a method of estimating relative displacement and a control method in the example. In FIG. 2, lines corresponding to scalar quantities are shown by single lines and lines corresponding to arrangements of pieces of data are shown by double lines.

In FIG. 2, a trajectory generation unit 2031 calculates and generates a target trajectory of the movable table using the preset movement parameters. A controller 2032 calculates the drive force of the linear motor using the relative displacement of the generated target trajectory and the positioning target object and the position information of the Movable table. Here, the configuration of the control system may be constructed by a feedback control system that is generally available in the field, such as general PID control or state feedback control. Further, a two-degree of freedom control system including feedforward control in addition to the feedback control is constructed, and thereby, stability and responsiveness may be supported at the same time. For design of the feedback control system and the feedforward control system, it is desirable that a control system that suppresses vibration in consideration not only of the resonance characteristics of the movable stage but also of the characteristics of the positioning target object is constructed.

According to the positioning mechanism 1, the movable table is driven by the calculated drive force of the linear motor, and position information D21 of the movable table by the laser interferometer and information D22 of various acceleration sensors are output.

An object transmission model 2011 is transmission characteristics of the positioning target object identified in advance and a model defining how first to N-order vibration modes of the positioning target object are excited by the drive force of the movable stage. Using the object transmission model 2011, mode amplitude estimation values D23 with respect to each of the first to N-order vibration modes of the object structure are calculated. A sensor output model 2012 is output functions from the mode amplitude estimation values D23 to the respective sensor output estimation values. Values obtained by multiplication of differences between the obtained sensor output estimation values and the values D22 of the acceleration sensors actually obtained from the positioning apparatus 1 by observer gain 2013 are fed back to the object transmission model 2011. Thereby, the modelization errors existing in the transmission models and sensor signals and influences by noise may be suppressed and the values of the mode amplitude estimation values D23 may be accurately estimated. An object displacement output model 2014 calculates amounts of displacement D25 of the electron microscope and the optical microscope using the mode amplitude estimation values D23. In this regard, the object displacement output model 2014 may calculate the amounts of displacement D25 as superimposition of vibration modes using vibration mode shapes identified by an analysis or the like in advance.

A stage transmission model 2015 is transmission characteristics from the drive force of the linear motor identified in advance to the movable table position. Using the stage transmission model 2015, table displacement estimation values D24 are calculated. Values obtained by multiplication of differences between the obtained table displacement estimation values and the position information D21 of the laser interferometer actually obtained from the positioning apparatus 1 by observer gain 2016 are fed back to the stage transmission model 2015. Thereby, the modelization errors existing in the transmission models and laser interference signals and influences by noise may be suppressed and the position of the movable table may be accurately estimated. A movable point displacement model calculates displacement D26 of the movable point from the table displacement estimation values D24. Here, the movable point displacement model calculates the movable point displacement using the table displacement estimation values D24, however, may use the table displacement D21 actually measured.

A difference signal D27 between the obtained object displacement and movable point displacement is relative displacement of the object and the movable point. Here, the difference signal D27 is pieces of relative displacement information with respect to a plurality of positioning target objects. Accordingly, relative displacement signals D28 according to the positioning target objects are calculated by the relative displacement selection unit 202, and output to the controller 2032.

According to the control device 2 having the above described configuration, the relative displacement relative to the plurality of positioning target objects are accurately estimated and the relative displacement is selected according to the positioning states, and thereby, the movable point and the positioning target objects may be positioned with high accuracy.

Figure 3:
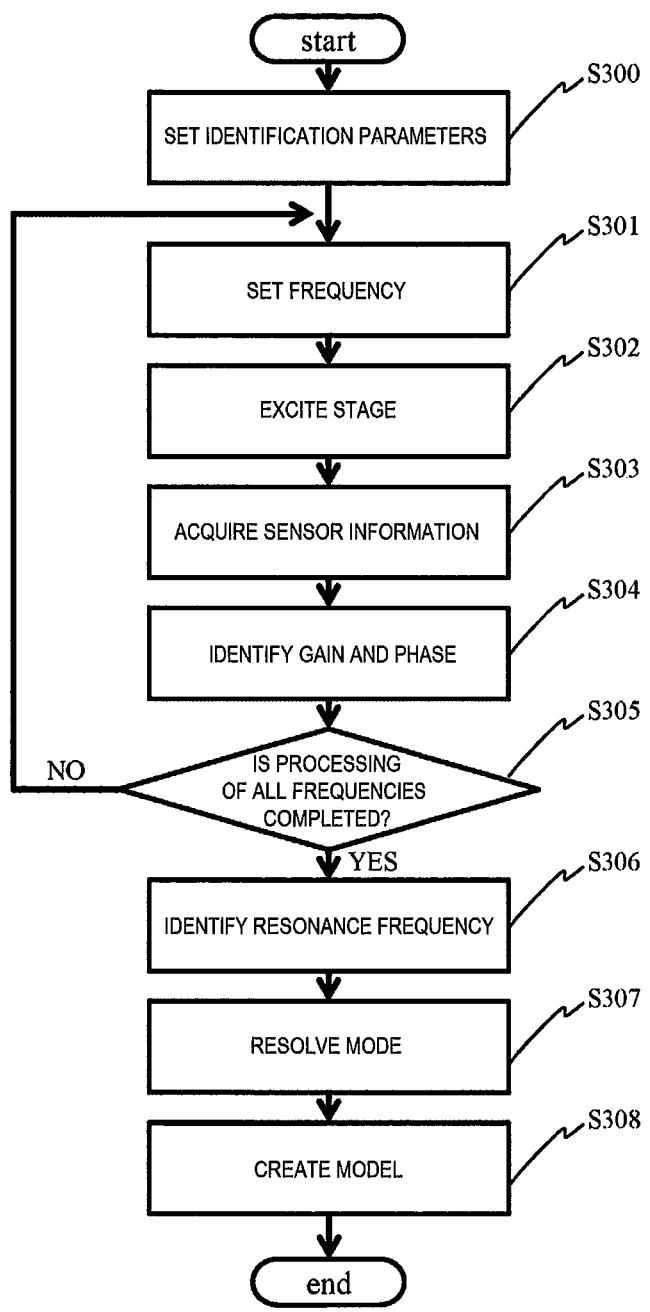
FIG. 3 is a flowchart showing processing of an identification unit of a mechanism model in example 1.

FIG. 3 is a flowchart showing processing of an identification unit of a mechanism model in the example. Here, the mechanism model specifically indicates the object transmission model 2011, the stage transmission model 2015, and various output models 2012, 2014, 2017.

When the identification processing of the transmission model is started, first, at processing S300, identification parameters are set. Specifically, a frequency range, an input amplitude, an excitation cycle number, an identification mode number N, etc. for identification are set.

Processing S301 is frequency setting processing and sets a start frequency for identification.

Processing S302 is stage excitation processing and excites at the frequency set at processing S301 with stage sine wave.

Processing S303 is sensor information acquisition processing and acquires information of various sensors (laser interferometer, acceleration sensors, etc.) during excitation of the stage at processing S302.

Processing S304 is gain and phase identification processing and calculates an amplitude ratio (gain) and a phase difference from the sensor information and the excitation signal obtained at processing S303. Specifically, a method of identifying the transmission characteristics using Fourier series, a method of directly identifying the gain and the phase of time response, or the like is used.

At processing S305, whether or not excitation at all identification frequencies is completed is determined, and, if the excitation is not completed, the process moves to the processing S301, the frequency is changed, and the stage excitation is performed again.

Processing S306 identifies the resonance frequency at which the vibration mode exists from the obtained characteristics of the gain and the phase over the whole range of the identification frequency. Specifically, the identification is performed by detection of peaks of the gain characteristics. Here, the maximum N of vibration modes are identified. As N is made larger, the modelization error when the vibration modes are superimposed is smaller, but the calculation may take time.

At processing S307, the transmission characteristics are resolved to vibration modes at the resonance frequency. Further, at S308, models are constructed as transmission models from the table drive force to the mode amplitude and from the table drive force to the stage displacement.

According to the positioning control device having the above described configuration, the amounts of relative displacement of the movable point and the plurality of positioning target object points are accurately estimated and the amount of relative displacement is changed for each positioning movement, and thereby, relative positioning may be performed with high accuracy with respect to the object points and the amounts of relative displacement may be disclosed to the user, and the user may numerically evaluate the apparatus performance.

Example 2

Figure 4:
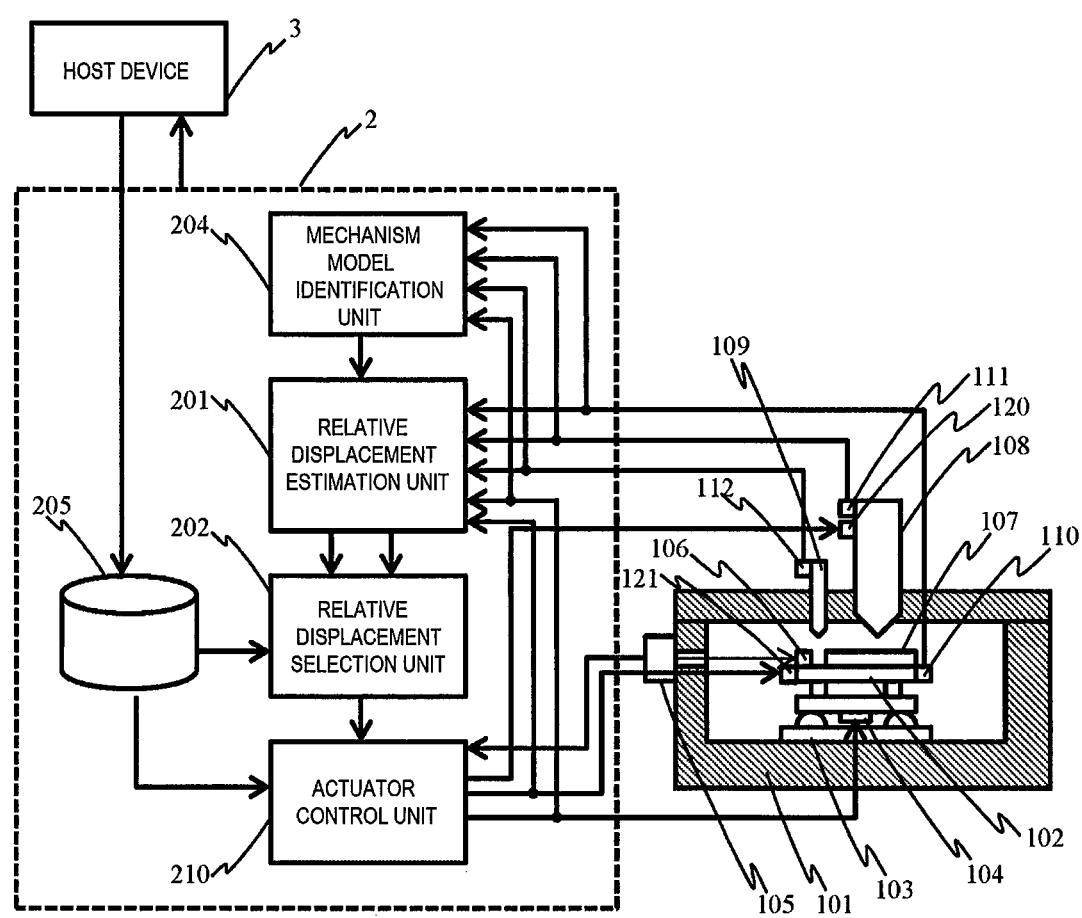
FIG. 4 is a conceptual diagram showing a configuration of a positioning apparatus in example 2.

FIG. 4 is a conceptual diagram showing a configuration of a positioning apparatus in example 2. In FIG. 4, the members shown by the same numbers as those in FIG. 1 have the same configurations and functions and their explanation will be omitted.

In FIG. 4, a stage actuator 121 using a piezoelectric element is mounted on the movable table 102. Similarly, a column actuator 120 using a piezoelectric element is mounted on the electron microscope 108. According to the configuration, the vibration of the movable table itself and the vibration of the electron microscope column maybe further suppressed. Here, in FIG. 4, it is necessary to construct a control system that simultaneously controls the linear motor 104 of the movable table 102, the stage actuator 121, the column actuator 120 in an actuator control unit 210. In this case, a method of constructing a plurality of single-input single-output control systems with sets of sensors and actuators or a method of constructing a multi-input multi-output control system that calculates a plurality of actuator outputs from pieces of sensor information may be employed.

Further, in the example, the actuators are added to the movable table 102 and the electron microscope 108, but not added to the optical microscope 109. This is because the electron microscope has higher power than the optical microscope and requires higher positioning accuracy. That is, as in the example, the actuator is added to the structure particularly requiring accuracy or causing larger relative displacement, and thereby, a higher effect is obtained more efficiently. Further, two or more actuators may be added to the electron microscope 108, for example. Thereby, the improvement in responsiveness and the suppression effect with respect to the higher order modes may be obtained.

Note that, in the example, the configuration using the actuator using the piezoelectric element is shown, however, the same effect may be readily imagined using e.g., an electromagnetic actuator or the like. The same effect may be expected using a mass actuator.

Example 3

Figure 5:
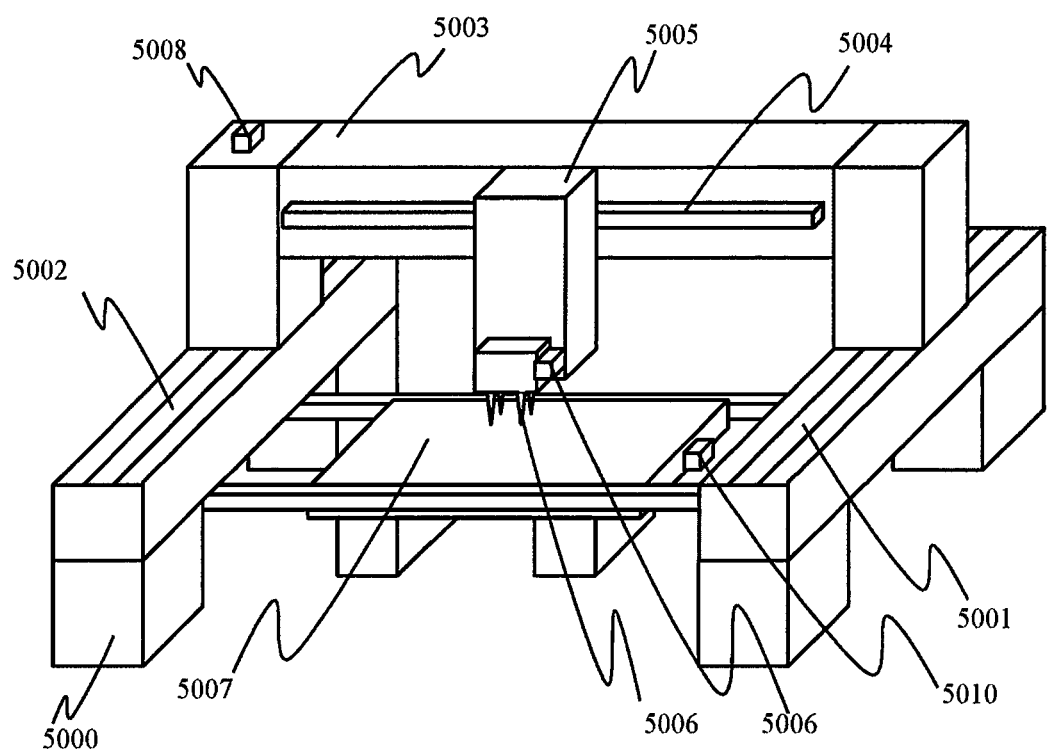
FIG. 5 is a perspective view showing a configuration of a component mounting apparatus in example 3.
Figure 5:
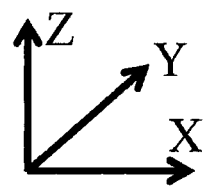

FIG. 5 is a perspective view showing a configuration of a component mounting apparatus in example 3.

In FIG. 5, a Y beam 5003 movable in the Y direction in the drawing is driven and positioned in the Y direction with respect to a base 5000 by two Y linear motors 5001 and 5002. Similarly, a mounting head 5005 is driven and positioned in the X direction with respect to the Y beam by an X linear motor 5004. Thereby, the mounting head 5005 is freely positioned in the XY plane. The mounting head 5005 includes a plurality of suction nozzles 5006, and the respective suction nozzles 5006 suction and hold components and are movable in the Z direction to mount the components in arbitrary positions on a printed board 5007.

Here, acceleration sensors 5008, 5009, 5010 are provided on the Y beam 5003, the mounting head 5005, and a stage on which the print board 5007 is mounted. Thereby, in the same method as shown in FIGS. 1 and 2, the relative displacement of the mounting head 5005 and the printed board 5007 may be estimated and positioning with high accuracy may be realized based thereon. Note that the placement of the sensors in the example is not limited to that, but the sensors may be attached to arbitrary positions within the apparatus.

The invention claimed is:

1. A positioning apparatus comprising:
a positioning apparatus including a movable stage;
a stage position detector that detects a position of the movable stage;
a first sensor attached to the movable stage;
one or more second sensors separate from the movable stage;
a control device programmed to control positioning of the movable stage,
wherein the control device is further programmed to:
identify a mechanism model for estimation of relative displacement between a position target and the movable stage;
estimate an amount of the relative displacement between the position target object and the movable stage due to vibration based on the first sensor, the second sensors and the stage position detector, a drive force output to position the movable stage, and the mechanism model, and
control the positioning of the movable stage according to the estimated amount of relative displacement.

2. A positioning apparatus comprising:
a positioning apparatus including a movable stage and a stage actuator;
a stage position detector that detects a position of the movable stage;
a first sensor attached to the movable stage;
one or more second sensors separate from the movable stage;
a control device programmed to control positioning of the movable stage and control the stage actuator,
wherein the control device is further programmed to:
identify a mechanism model for estimation of relative displacement between a position target object and the movable stage;
estimate an amount of the relative displacement between the position target object and the movable stage due to vibration based on the first sensor, the second sensors and the stage position detector, a drive force output to position the movable stage, and the identified mechanism model due to vibration, and
control the positioning of the movable stage and the stage actuator according to the estimated amount of relative displacement.

3. The positioning control device according to claim 1, wherein the positioning target object includes at least two points within a movable range of the movable stage, and
wherein the amount of relative displacement is estimated with respect to the at least two points.

4. The positioning control device according to claim 1, wherein the mechanism model includes an object transmission model, a stage transmission model and one or more output models.

5. The positioning control device according to claim 1, wherein the control device is further programmed to:
calculate an amplitude with respect to each vibration mode of the positioning target object using the mechanism model,
calculate output values of the first sensor, the second sensors and the stage position detector with respect to each vibration mode of the positioning target object using a sensor output model, and
calculate displacement of the positioning target object using an object displacement model.

6. The positioning control device according to claim 5, wherein the amount of relative displacement is estimated using the calculated amplitude, the calculated output values and the calculated displacement.

7. The positioning control device according to claim 4, wherein the control device is further programmed to:
acquire transmission characteristics from the drive force of the stage to the first sensor, the second sensors and the stage position detector.

8. The positioning control device according to claim 1, wherein the control device is further programmed to:
output a notification of the amount of relative displacement.

9. A semiconductor inspection apparatus comprising the positioning control device according to claim 1.

10. A component mounting apparatus comprising the positioning control device according to claim 1.

11. The positioning control device according to claim 2, wherein the positioning target object includes at least two movable points within a movable range of the movable stage,
wherein the amount of relative displacement is estimated with respect to the at least two points.

12. The positioning control device according to claim 2, wherein the mechanism model includes an object transmission model, a stage transmission model and one or more output models.

13. The positioning control device according to claim 2, wherein the control device is further programmed to:
calculate an amplitude with respect to each vibration mode of the positioning target object using the mechanism model,
calculate output values of the first sensor, the second sensors and the stage position detector with respect to each vibration mode of the positioning target object using a sensor output model, and
calculate displacement of the positioning target object using an object displacement model.

14. The positioning control device according to claim 2 wherein the control device is further programmed to:
output a notification of the amount of relative displacement.

15. A semiconductor inspection apparatus comprising the positioning control device according to claim 2.

16. A component mounting apparatus comprising the positioning control device according to claim 2.

* * * * *